(12) United States Patent
Chen et al.

(10) Patent No.: US 10,043,967 B2
(45) Date of Patent: Aug. 7, 2018

(54) SELF-COMPENSATION OF STRAY FIELD OF PERPENDICULAR MAGNETIC ELEMENTS

(71) Applicant: QUALCOMM Incorporated, San Diego, CA (US)

(72) Inventors: Wei-Chuan Chen, Taipei (TW); Xiaochun Zhu, San Diego, CA (US); Xia Li, San Diego, CA (US); Yu Lu, San Diego, CA (US); Chando Park, San Diego, CA (US); Seung Hyuk Kang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 56 days.

(21) Appl. No.: 14/454,509

(22) Filed: Aug. 7, 2014

(65) Prior Publication Data
US 2016/0043304 A1 Feb. 11, 2016

(51) Int. Cl.
| | | |
|---|---|---|
| *H01L 29/82* | (2006.01) | |
| *H01L 43/08* | (2006.01) | |
| *H01L 43/02* | (2006.01) | |
| *H01L 43/10* | (2006.01) | |
| *H01L 43/12* | (2006.01) | |

(52) U.S. Cl.
CPC .............. *H01L 43/08* (2013.01); *H01L 43/02* (2013.01); *H01L 43/10* (2013.01); *H01L 43/12* (2013.01)

(58) Field of Classification Search
CPC ..... H01L 27/222; H01L 27/224; H01L 43/02; H01L 43/08; H01L 43/10

USPC .......................................................... 257/421
See application file for complete search history.

(56) References Cited

U.S. PATENT DOCUMENTS

| | | | |
|---|---|---|---|
| 6,211,090 B1 | 4/2001 | Durlam et al. | |
| 8,679,577 B2 | 3/2014 | Gao et al. | |
| 2008/0273380 A1* | 11/2008 | Diao | ................. G11C 11/16 365/171 |
| 2009/0080125 A1 | 3/2009 | Kondo | |
| 2010/0032777 A1* | 2/2010 | Gao | ................. B82Y 25/00 257/421 |
| 2010/0032780 A1* | 2/2010 | Ang | ................. H01L 43/08 257/421 |
| 2010/0135067 A1 | 6/2010 | Dimitrov et al. | |
| 2011/0233697 A1* | 9/2011 | Kajiyama | ................. G11C 11/16 257/421 |

(Continued)

OTHER PUBLICATIONS

International Search Report and Written Opinion—PCT/US2015/035175—ISA/EPO—Jan. 25, 2016.

*Primary Examiner* — Meiya Li
*Assistant Examiner* — Peter M Albrecht
(74) *Attorney, Agent, or Firm* — Seyfarth Shaw LLP

(57) ABSTRACT

A perpendicular magnetic tunnel junction (pMTJ) device includes a perpendicular reference layer, a tunnel barrier layer on a surface of the perpendicular reference layer, and a perpendicular free layer on a surface of the tunnel barrier layer. The pMTJ device also includes a dielectric passivation layer on the tunnel barrier layer and surrounding the perpendicular free layer. The pMTJ device further includes a high permeability material on the dielectric passivation layer that is configured to be magnetized by the perpendicular reference layer and to provide a stray field to the perpendicular free layer that compensates for a stray field from the perpendicular reference layer.

12 Claims, 10 Drawing Sheets

(56) References Cited

U.S. PATENT DOCUMENTS

| | | |
|---|---|---|
| 2013/0037862 A1 | 2/2013 | Kitagawa et al. |
| 2013/0037892 A1* | 2/2013 | Park ........................ H01L 43/12 |
| | | 257/421 |
| 2013/0069184 A1 | 3/2013 | Aikawa et al. |
| 2013/0161768 A1 | 6/2013 | Khvalkovskiy et al. |
| 2013/0240963 A1 | 9/2013 | Beach et al. |
| 2014/0319632 A1* | 10/2014 | Guo ........................ H01L 43/12 |
| | | 257/421 |
| 2015/0091109 A1* | 4/2015 | Allinger ................ H01L 23/552 |
| | | 257/421 |
| 2015/0214474 A1* | 7/2015 | Nishimura ........... C21D 8/1277 |
| | | 438/3 |
| 2015/0270481 A1* | 9/2015 | Annunziata ............. H01L 43/08 |
| | | 257/421 |
| 2016/0035969 A1* | 2/2016 | Kang ...................... H01L 43/08 |
| | | 257/421 |

* cited by examiner

SELF-COMPENSATION OF STRAY FIELD OF PERPENDICULAR MAGNETIC ELEMENTS

TECHNICAL FIELD

The present disclosure generally relates to magnetic tunnel junction (MTJ) devices. More specifically, the present disclosure relates to methods for self-compensation of stray field of perpendicular magnetic elements.

BACKGROUND

Unlike conventional random access memory (RAM) chip technologies, in magnetic RAM (MRAM) data is stored by magnetization of storage elements. The basic structure of the storage elements consists of metallic ferromagnetic layers separated by a thin tunneling barrier. Typically, the ferromagnetic layers underneath the barrier (e.g., the pinned layer) have a magnetization that is fixed in a particular direction. The ferromagnetic magnetic layers above the tunneling barrier (e.g., the free layer) have a magnetization direction that may be altered to represent either a "1" or a "0." For example, a "1" may be represented when the free layer magnetization is anti-parallel to the fixed layer magnetization. In addition, a "0" may be represented when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel to each other. A memory device such as MRAM is built from an array of individually addressable MTJs.

To write data in a conventional MRAM, a write current, which exceeds a critical switching current, is applied through an MTJ. Application of a write current that exceeds the critical switching current changes the magnetization direction of the free layer. When the write current flows in a first direction, the MTJ may be placed into or remain in a first state in which its free layer magnetization direction and fixed layer magnetization direction are aligned in a parallel orientation. When the write current flows in a second direction, opposite to the first direction, the MTJ may be placed into or remain in a second state in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a parallel resistance. The parallel resistance is different than a resistance (anti-parallel) the MTJ would present if the magnetizations of the free layer and the fixed layer were in an anti-parallel orientation. In a conventional MRAM, two distinct states are defined by these two different resistances of an MTJ in a bitcell of the MRAM. The two different resistances indicate whether a logic "0" or a logic "1" value is stored by the MTJ.

Spin-transfer-torque magnetic random access memory (STT-MRAM) is an emerging nonvolatile memory that has advantages of non-volatility. In particular, STT-MRAM operates at a higher speed than off chip dynamic random access memory (DRAM). In addition, STT-MRAM has a smaller chip size than embedded static random access memory (eSRAM), unlimited read/write endurance, and a low array leakage current.

Perpendicular magnetic tunnel junctions (pMTJs) may be elements within STT-MRAMs. For the writing of STT-MRAMs with pMTJs, the asymmetry of switching is a critical issue for production. A contributing factor for unbalanced switching for pMTJs is the stray field of a pin layer (e.g., the reference layer). A synthetic antiferromagnetic (SAF) pin structure and stopping the MTJ etching on the barrier scheme were proposed for solving this issue. However, those approaches do not fully solve the issue and lead to the MTJ stack becoming overly complicated.

SUMMARY

A perpendicular magnetic tunnel junction (pMTJ) device includes a perpendicular reference layer, a tunnel barrier layer on a surface of the perpendicular reference layer, and a perpendicular free layer on a surface of the tunnel barrier layer. The pMTJ device also includes a dielectric passivation layer on the tunnel barrier layer and surrounding the perpendicular free layer. The pMTJ device further includes a high permeability material on the dielectric passivation layer that is configured to be magnetized by the perpendicular reference layer and to provide a stray field to the perpendicular free layer that compensates for a stray field from the perpendicular reference layer.

Another pMTJ device includes a perpendicular reference layer, a tunnel barrier layer on a surface of the perpendicular reference layer, and a perpendicular free layer on a surface of the tunnel barrier layer. The pMTJ device also includes a dielectric passivation layer on the tunnel barrier layer and surrounding the perpendicular free layer. The pMTJ device further includes a means for providing a stray field to the perpendicular free layer that compensates for the stray field from the perpendicular reference layer.

A method of fabricating a pMTJ device includes depositing a magnetic tunnel junction (MTJ) stack, and etching a portion of the MTJ stack to a tunnel barrier layer. The method also includes depositing a dielectric passivation layer on the tunnel barrier layer, and depositing a high permeability material on the dielectric passivation layer.

A computer program product for fabricating a pMTJ device includes a non-transitory computer-readable medium having non-transitory program code recorded thereon. The program code includes program code to deposit a MTJ stack, program code to etch a portion of the MTJ stack to a tunnel barrier layer, program code to deposit a dielectric passivation layer on the tunnel barrier layer, and program code to deposit a high permeability material on the dielectric passivation layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

MRAM is a non-volatile memory technology that uses magnetic elements. For example, spin transfer torque magnetoresistive random access memory (STT-MRAM) uses electrons that become spin-polarized as the electrons pass through a thin film (spin filter). STT-MRAM is also known as spin transfer torque RAM (STT-RAM), spin torque transfer magnetization switching RAM (Spin-RAM), and spin momentum transfer (SMT-RAM). STT-MRAM is also an emerging nonvolatile memory that has advantages of non-volatility. In particular, STT-MRAM operates at a higher speed than off chip dynamic random access memory (DRAM). In addition, STT-MRAM has a smaller chip size than embedded static random access memory (eSRAM), unlimited read/write endurance, and a low array leakage current.

Bitcells of a magnetic random access memory may be arranged in one or more arrays including a pattern of memory elements (e.g., MTJs in case of MRAM). Perpendicular magnetic tunnel junctions (pMTJs) may be elements within STT-MRAMs. For the writing of STT-MRAMs with pMTJs, the asymmetry of switching is a critical issue for production. A contributing factor for unbalanced switching for pMTJs is the stray field of a pin layer (e.g., the reference layer).

According to one aspect of the present disclosure, an MTJ or pMTJ design provides self-compensation of stray fields for a single pin layer or a synthetic antiferromagnetic pin layer. The implementation of the design is compatible with current MTJ device integration. In addition, the disclosed pMTJ structure having a single pin layer may improve the thermal stability of the pin layer due to its simplistic structure.

Figure 1:
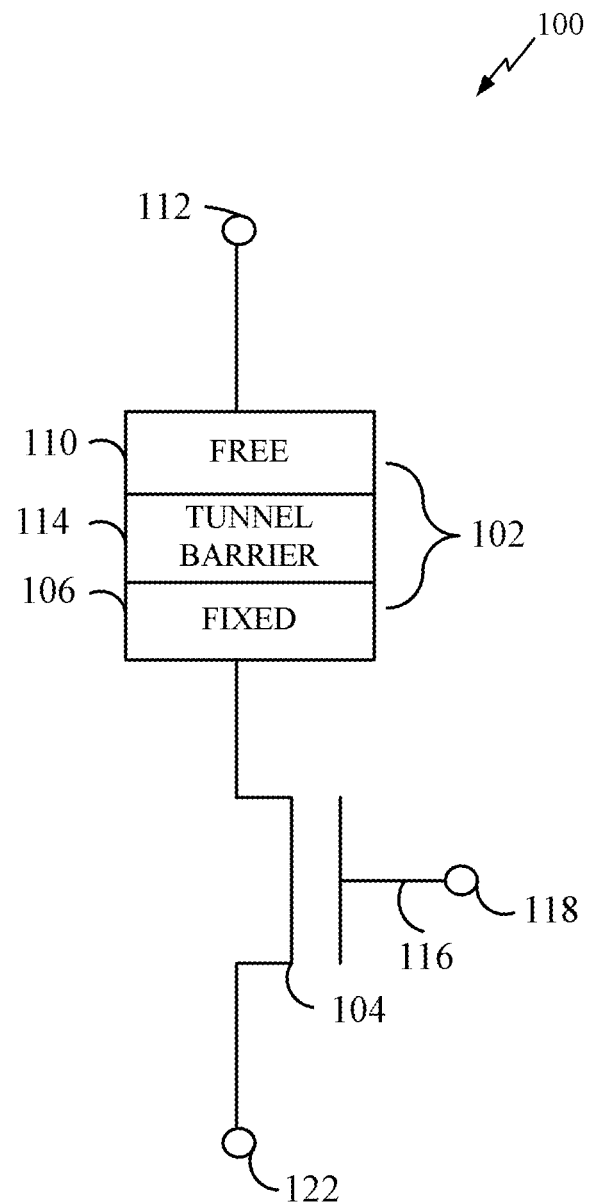
FIG. 1 is a diagram of a magnetic tunnel junction (MTJ) device connected to an access transistor.

FIG. 1 illustrates a memory cell 100 of a memory device including a magnetic tunnel junction (MTJ) 102 coupled to an access transistor 104. The memory device may be a magnetic random access memory (MRAM) device that is built from an array of individually addressable MTJs. An MTJ stack may include a free layer, a fixed layer and a tunnel barrier layer there between as well as one or more ferromagnetic layers. Representatively, a free layer 110 of the MTJ 102 is coupled to a bit line 112. The access transistor 104 is coupled between a fixed layer 106 of the MTJ 102 and a fixed potential node 122. A tunnel barrier layer 114 is coupled between the fixed layer 106 and the free layer 110. The access transistor 104 includes a gate 116 coupled to a word line 118.

Synthetic anti-ferromagnetic materials may form the fixed layer 106 and the free layer 110. For example, the fixed layer 106 may comprise multiple material layers including a cobalt-iron-boron (CoFeB) layer, a ruthenium (Ru) layer and a cobalt-iron (CoFe) layer. In addition, the free layer 110 may also include multiple material layers including a cobalt-iron-boron (CoFeB) layer, a ruthenium (Ru) layer and a cobalt-iron (CoFe) layer. Further, the tunnel barrier layer 114 may be magnesium oxide (MgO).

Figure 2:
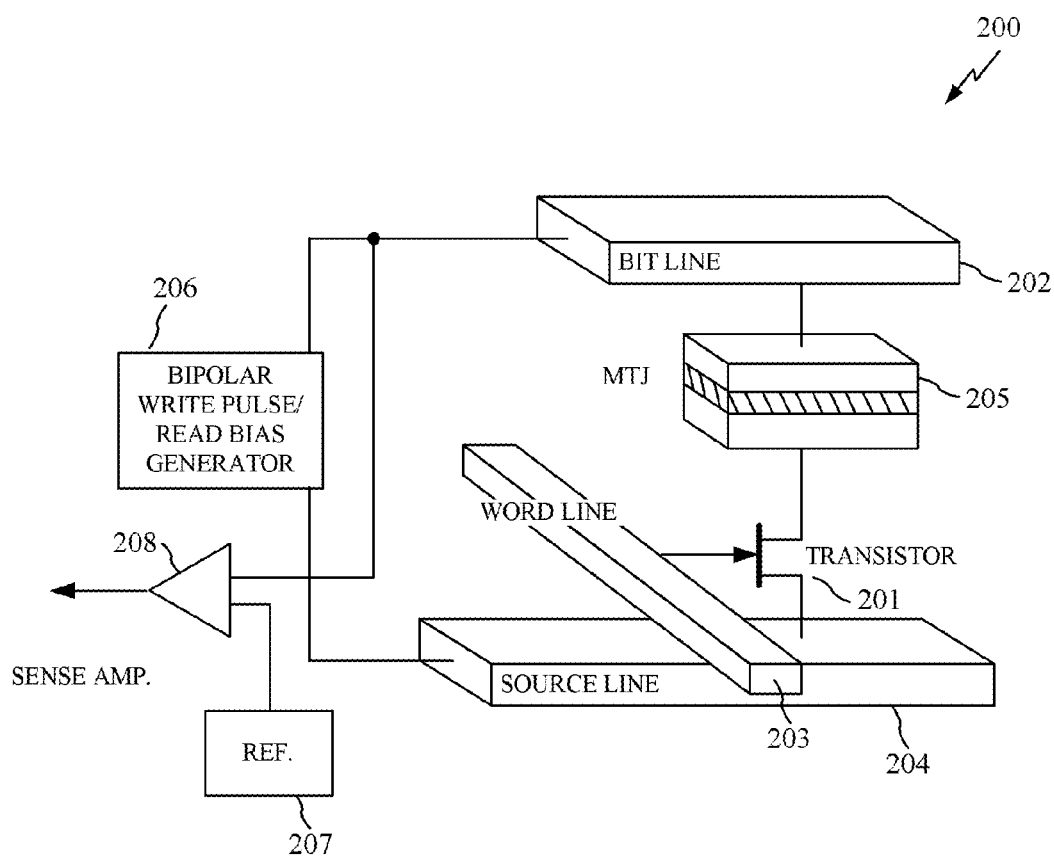
FIG. 2 is a conceptual diagram of a conventional magnetic random access memory (MRAM) cell including an MTJ.

FIG. 2 illustrates a conventional STT-MRAM bit cell 200. The STT-MRAM bit cell 200 includes a magnetic tunnel junction (MTJ) storage element 205, a transistor 201, a bit line 202 and a word line 203. The MTJ storage element 205 is formed, for example, from at least two ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned or opposite. The resistance of the electrical path through the MTJ varies depending on the alignment of the polarizations of the pinned and free layers. This variance in resistance may program and read the bit cell 200. The STT-MRAM bit cell 200 also includes a source line 204, a sense amplifier 208, read/write circuitry 206 and a bit line reference 207.

Figure 3:
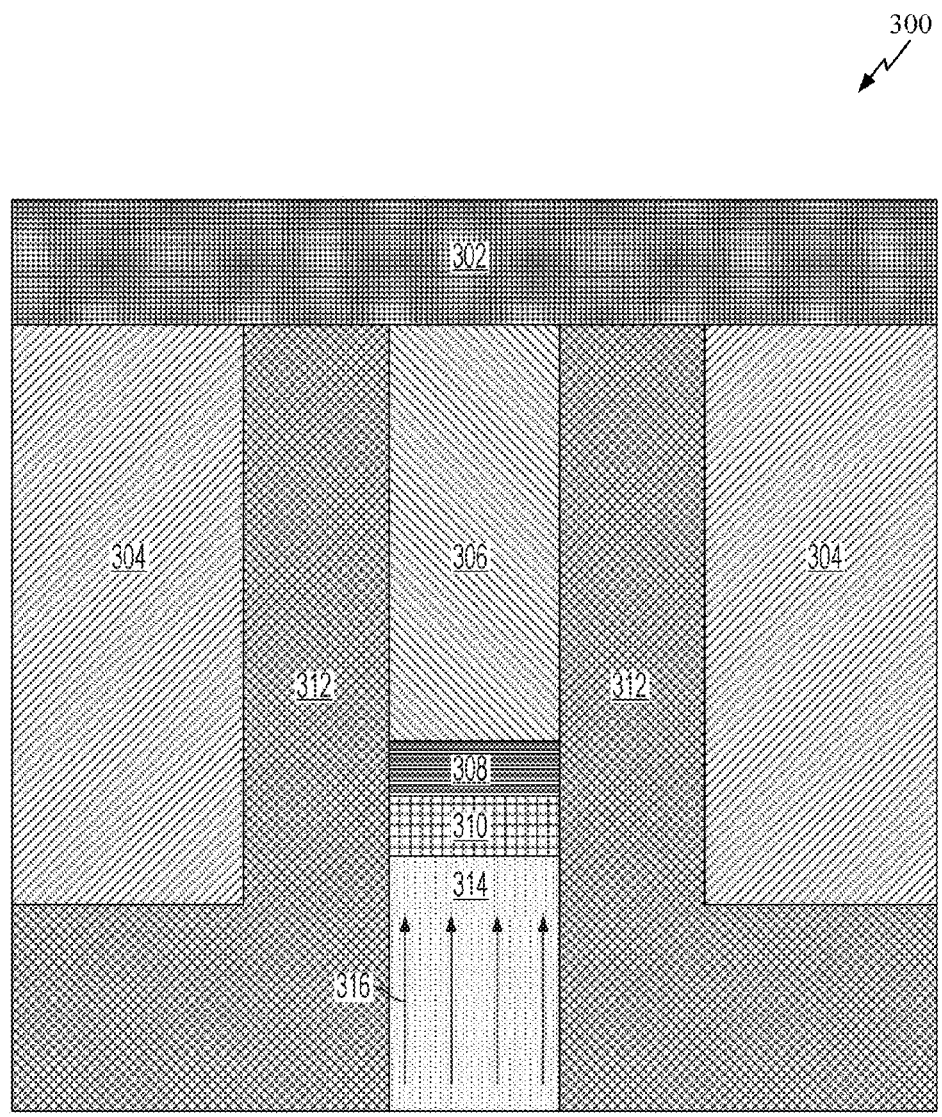
FIG. 3 is a cross-sectional view of a MTJ device experiencing asymmetric switching according to aspects of the present disclosure.

FIG. 3 is a cross-sectional view of an MTJ device 300 that exhibits asymmetric switching according to aspects of the present disclosure. The MTJ device 300 includes a top electrode 302, a dielectric 304, a hard mask 306, a perpendicular free layer 308, a tunnel barrier layer 310, a perpendicular reference layer 314, and a dielectric passivation layer 312. A magnetic field 316 can be seen within the perpendicular reference layer 314.

The MTJ device 300 experiences an asymmetric switching field (e.g., current) due to a stray field or dipole field from the perpendicular reference layer 314 (or the pinned layer) when writing to the MTJ device 300. This asymmetric switching provides a substantial obstacle to commercial production of the MTJ device 300. Some of the asymmetric switching fields can be seen in lines of the magnetic field 316 within the perpendicular reference layer 314.

The design of the MTJ device 300 involves a complicated MTJ stack, especially if a synthetic antiferromagnetic (SAF) pin layer is used within the design. The MTJ device 300 also exhibits a poor variation of device properties such as a coercive field (Hc), an offset field (Hoff), a current density (Jc), an energy barrier (Eb), and/or a tunnel magneto-resistance (TMR). If there was a graph plotting field (H) or current (I) on the x-axis and resistance on the y-axis, usually called a RH loop or a RI loop, then the plot for the MTJ device 300 would look like a hysteresis square, or a hysteresis curve but with the curved portions being nearly straight.

Figure 4:
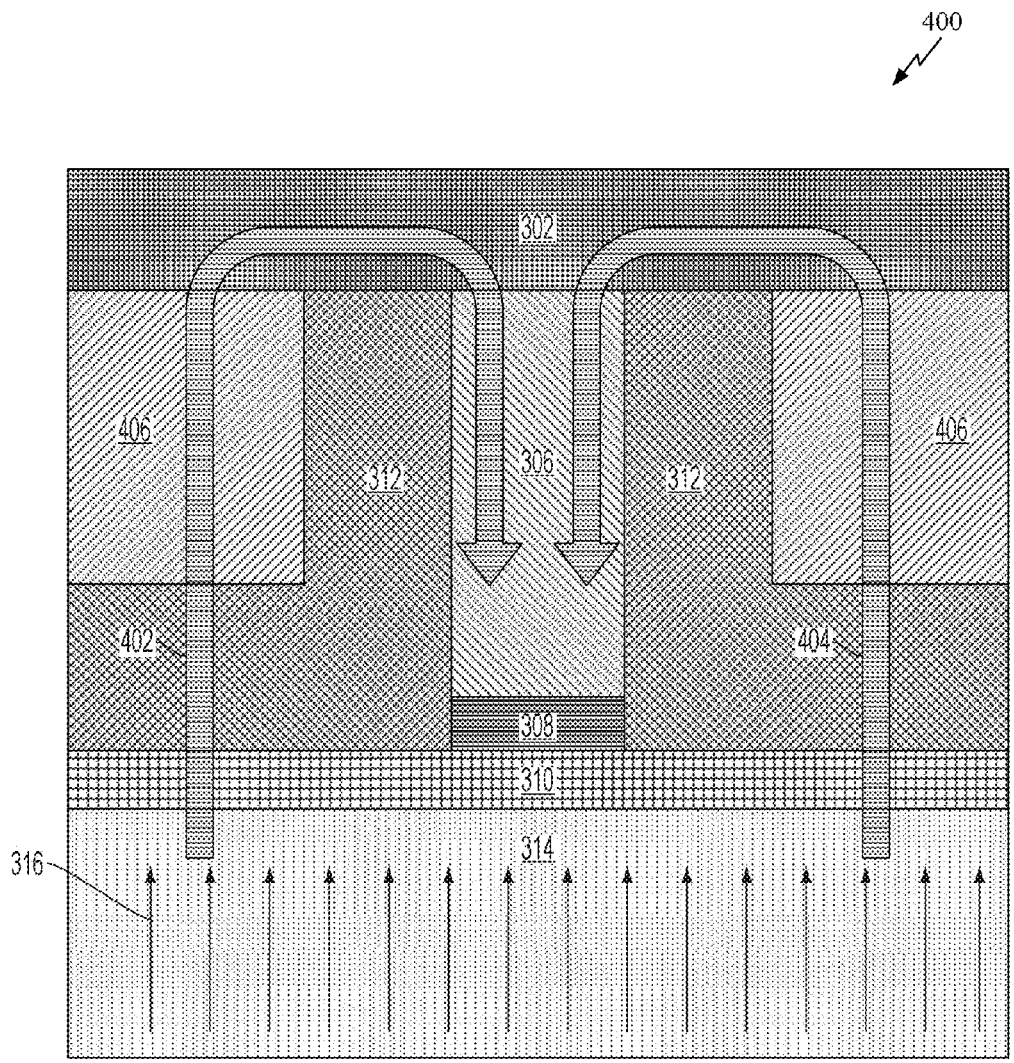
FIG. 4 is a cross-sectional view of a MTJ device configured for self-compensation of stray field according to aspects of the present disclosure.

FIG. 4 is a cross-sectional view of a MTJ device 400 configured for self-compensation of stray field according to one aspect of the present disclosure. The MTJ device 400 of FIG. 4 is similar to the MTJ device 300 of FIG. 3, except that the perpendicular reference layer 314 and the tunnel barrier layer 310 are wider than the perpendicular free layer 308 and the hard mask 306, respectively. The perpendicular reference layer 314 extends laterally outside the perpendicular free layer 308 in this configuration.

Furthermore, a high permeability material 406 in the MTJ device 400 is located between the dielectric passivation layer 312 and the top electrode 302. The high permeability material 406 replaces the dielectric 304 in the MTJ device 300 of FIG. 3. The high permeability material 406 may include a Mu-metal, a nickel iron (NiFe)-based material, an iron-based material, ferrite, a permalloy, oxygen doping and/or nitride doping.

The increased widths of the perpendicular reference layer 314 and the tunnel barrier layer 310 in combination with the use of the high permeability material 406 provides a first self-compensation field 402 and a second self-compensation field 404. The first self-compensation field 402 and the second self-compensation field 404 compensate for and counteract the stray fields (e.g., the magnetic field 316) of the perpendicular reference layer 314. That is, the high permeability material 406 is magnetized and creates additional stray fields that cancel the stray fields from the pin layer. The first self-compensation field 402 and the second self-compensation field 404 flow from the perpendicular reference layer 314, through the tunnel barrier layer 310, the dielectric passivation layer 312, the high permeability material 406, the top electrode 302 and finally terminate in the hard mask 306 above the perpendicular free layer 308. Although not shown, an inter-metal dielectric (IMD) layer can be provided on the high permeability material 406 (e.g., between or partially between the top electrode 302 and the high permeability material 406.)

The self-compensation of the stray field triggered by the first self-compensation field 402 and the second self-compensation field 404 may occur for a single pin layer or synthetic antiferromagnetic pin layer in a pMTJ (or MTJ device). In one configuration, the perpendicular reference layer 314 is a single layer. In another configuration, the perpendicular reference layer 314 includes a SAF layer. In a further configuration, the perpendicular reference layer 314 extends laterally outside the perpendicular free layer 308.

A two-step etching process, or etching stop on barrier process, may fabricate the MTJ device 400 of FIG. 4. The etching stops at the tunnel barrier layer 310. Such an etching process is further described in FIGS. 6A-6D.

Figure 5:
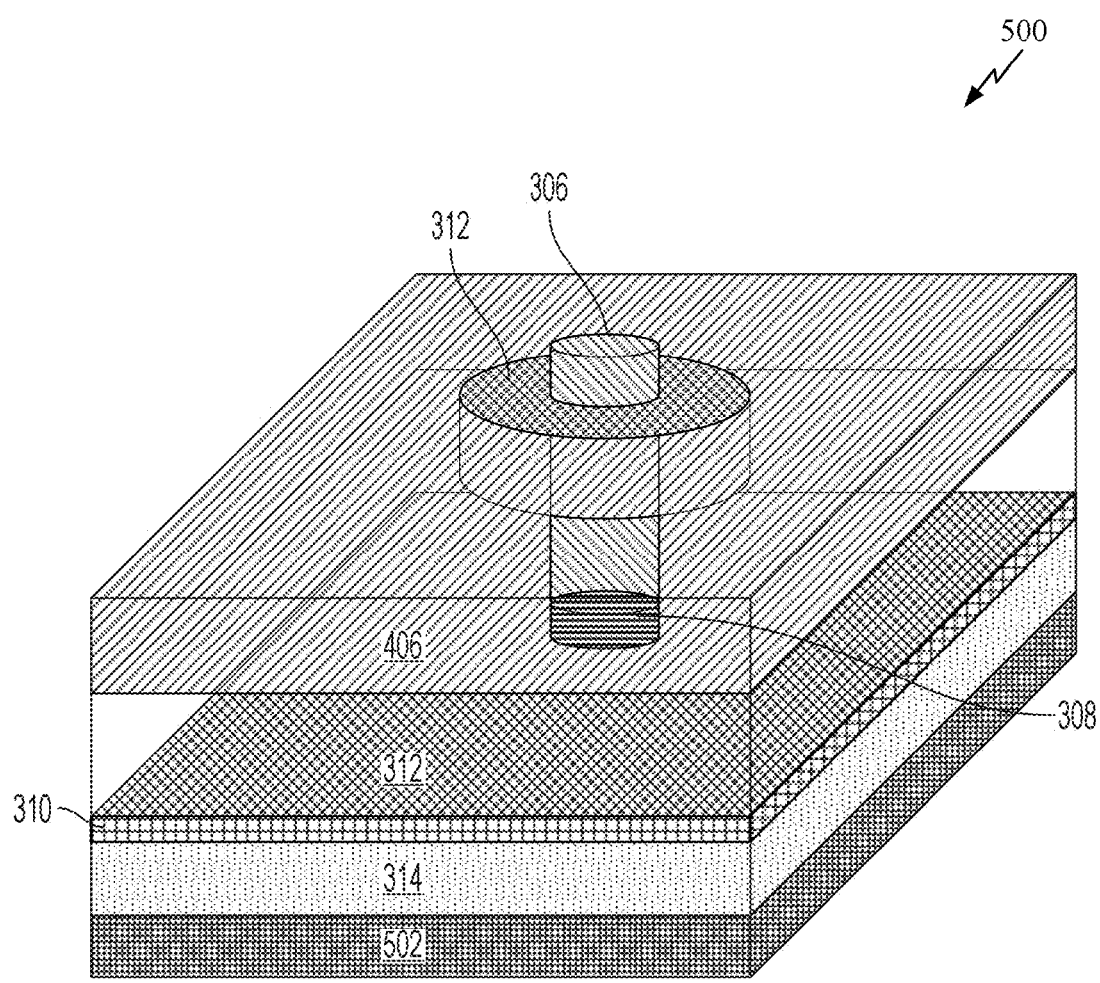
FIG. 5 is a 3D view of a MTJ device configured for self-compensation of stray field according to aspects of the present disclosure.

FIG. 5 is a 3D view of an MTJ device 500 configured for self-compensation of stray field according to one aspect of the present disclosure. The MTJ device 500 of FIG. 5 is similar to the MTJ device 400 of FIG. 4, except that all the components can be more clearly seen. For instance, the hard mask 306, the perpendicular free layer 308 and the dielectric passivation layer 312 are arranged in a cylindrical form, although those components are not limited to such a form and can be arranged in any shape, size, orientation or implementation. The high permeability material 406, another portion of the dielectric passivation layer 312, the tunnel barrier layer 310, and the perpendicular reference layer 314 are shown as rectangular prism-shaped layers. The high permeability material 406 may encapsulate a portion of the hard mask 306 and the upper portion of the dielectric passivation layer 312. The lower portion of the dielectric passivation layer 312 may encapsulate a portion of the hard mask 306 and the perpendicular free layer 308. A bottom electrode 502 appears at the bottom of the MTJ device 500, but other layers may be included, as shown in FIGS. 6A-6D.

FIGS. 6A-6D are cross-sectional views illustrating a method of fabricating a MTJ device with self-compensation of stray field according to one aspect of the present disclosure.

Figure 6A:
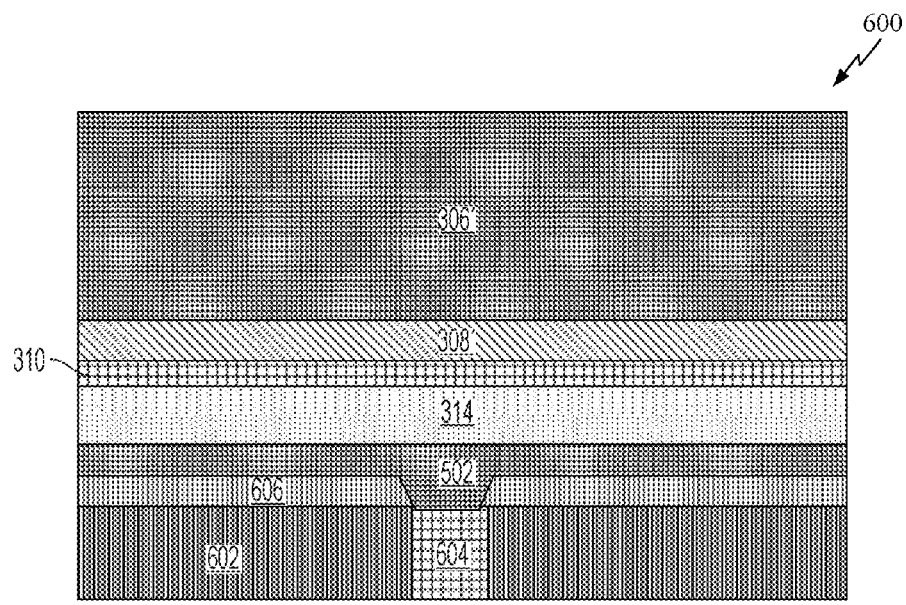
FIGS. 6A-6D are cross-sectional views illustrating a method of fabricating a MTJ device with self-compensation of stray field according to aspects of the present disclosure.

The cross-sectional view 600 of FIG. 6A shows a substrate 602 (which may also be an inter metal dielectric or IMD), a conductive material 604 (which may also be a via) within a portion of the substrate 602, an insulating layer 606 (which may also be a dielectric stop layer), a bottom electrode 502, a perpendicular reference layer 314, a tunnel barrier layer 310, a non-patterned perpendicular free layer 308', and a non-patterned hard mask layer 306'. The conductive material 604 may be aluminum, copper or other like conductive material. The perpendicular reference layer 314 (also known as the pinned layer) may be multiple material layers including a cobalt-iron-boron (CoFeB) layer, a ruthenium (Ru) layer and a cobalt-iron (CoFe) layer. The tunnel barrier layer 310 may be magnesium oxide (MgO). The non-patterned perpendicular free layer 308' may be multiple material layers including a cobalt-iron-boron (CoFeB) layer, a ruthenium (Ru) layer and a cobalt-iron (CoFe) layer. The non-patterned hard mask layer 306' and the bottom electrode 502 may be tantalum (Ta).

The non-patterned hard mask layer 306' and the non-patterned perpendicular free layer 308' are etched to the tunnel barrier layer 310. That is, the tunnel barrier layer 310 serves as an etch stop. A dielectric passivation layer 312 is then deposited over the tunnel barrier layer 310 and surrounding the perpendicular free layer 308 and the hard mask 306.

Figure 6B:
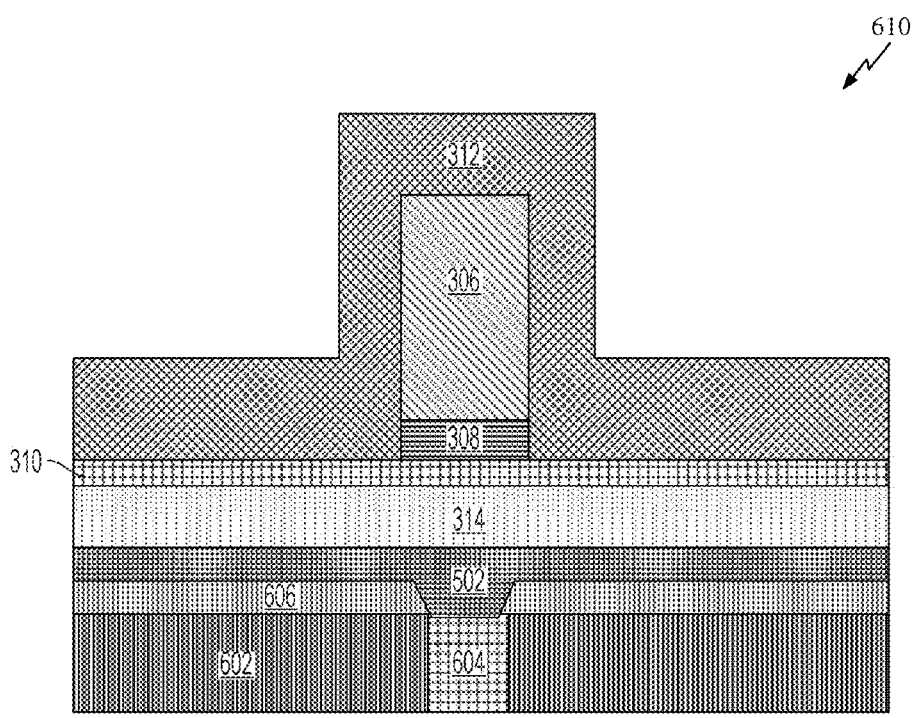

The cross-sectional view 610 of FIG. 6B shows similar components to the cross-sectional view 600 of FIG. 6A, except that the non-patterned perpendicular free layer 308' is patterned into the perpendicular free layer 308 and the non-patterned hard mask layer 306' is patterned into the hard mask 306, In addition, the dielectric passivation layer 312 is deposited on and around the tunnel barrier layer 310, the perpendicular free layer 308 and the hard mask 306. The perpendicular free layer 308 may be composed of multiple material layers including a cobalt-iron-boron (CoFeB) layer, a ruthenium (Ru) layer, an iron-tantalum (FeTa) layer, a rare-earth-transition-metal-alloy and/or magnesium oxide (MgO) capping layer, and a cobalt-iron (CoFe) layer. The dielectric passivation layer 312 may be silicon nitride (SiN), silicon oxynitride (SiON or $SiO_xN_y$), aluminum oxide ($AlO_x$), or silicon oxide ($SiO_x$).

In one configuration, a high permeability material 406 is deposited on the dielectric passivation layer 312. Then, a portion of the hard mask 306 is exposed by chemical mechanical polishing (CMP) and/or any etching back process. A top electrode 302 is then deposited and contacted with the hard mask 306. The top electrode 302, the high permeability material 406, the dielectric passivation layer 312, the tunnel barrier layer 310, the pin layer 314 and the bottom electrode 502 are then patterned. The hard mask 306 can be made of, for example, tantalum (Ta).

In another configuration, the dielectric passivation layer 312 is patterned further—either via chemical mechanical polishing (CMP) or an etching back process—so that a portion of the hard mask 306 extends above and does not contact the dielectric passivation layer 312. A high permeability material 406 is then deposited on the dielectric passivation layer 312.

Figure 6C:
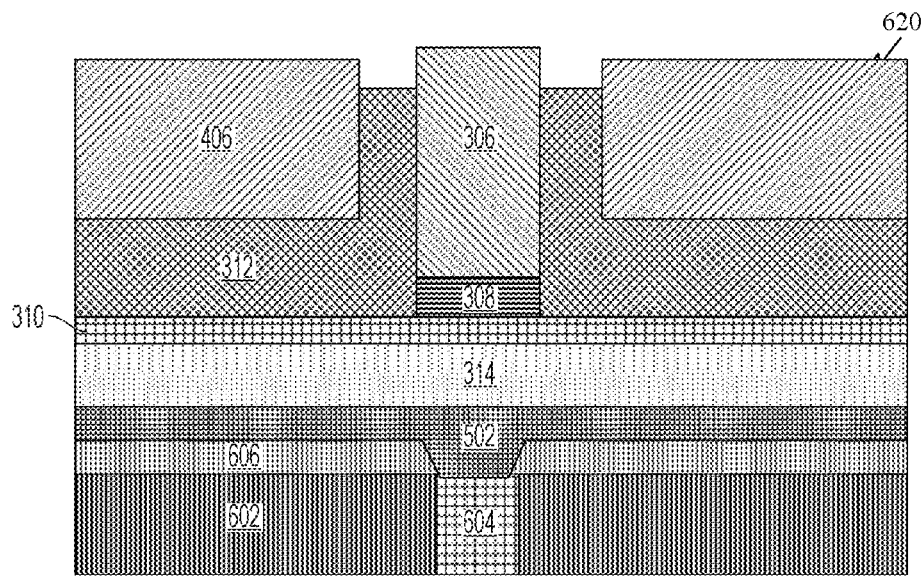

The cross-sectional view 620 of FIG. 6C shows similar components to the cross-sectional view 610 of FIG. 6B, except that the dielectric passivation layer 312 is patterned further, and the high permeability material 406 is deposited on the dielectric passivation layer 312 before any patterning. The high permeability material 406 is seen in the cross-sectional view 620 as deposited on both sides of the hard mask 306 and within valleys in the dielectric passivation layer 312. The high permeability material 406 may be a Mu-metal, a nickel iron (NiFe)-based material, an iron-based material, ferrite, a permalloy, oxygen doping and nitride doping.

A top electrode 302 is deposited on the high permeability material 406. In an optional configuration (not shown), an inter-metal dielectric (IMD) is deposited on the high permeability material 406. Then, the entire MTJ stack from the top electrode 302 down to the bottom electrode 502 is patterned and etched to a width less than the width of the insulating layer 606 and the substrate 602. This may be referred to as a defining process.

Figure 6D:
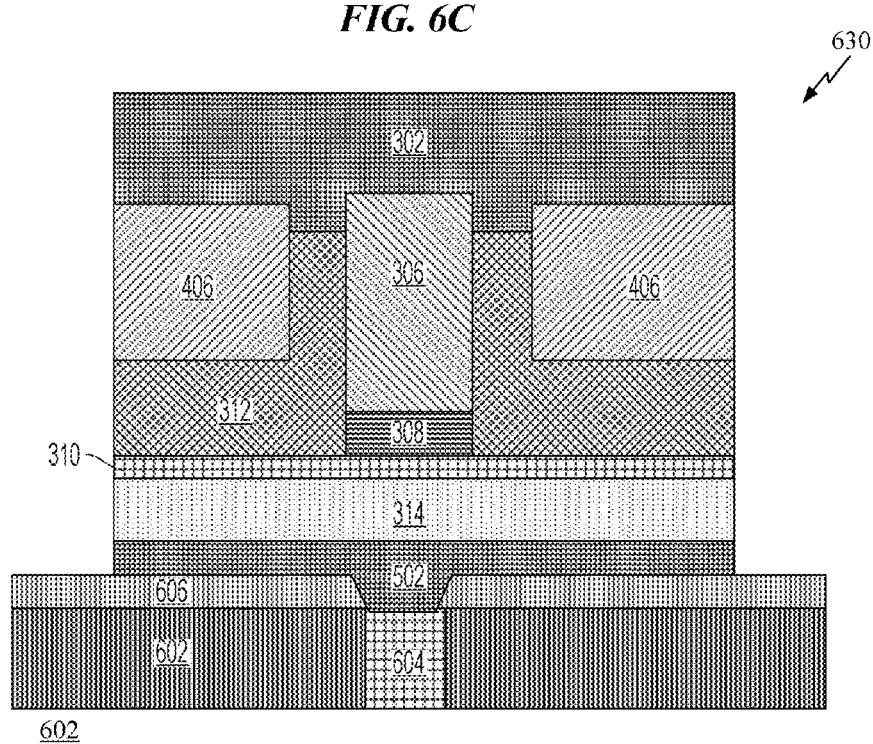

The cross-sectional view 630 of FIG. 6D shows similar components to the cross-sectional view 620 of FIG. 6C, except that the top electrode 302 is deposited over the high permeability material 406 and the hard mask 306. In addition, the entire MTJ stack, from the top electrode 302 to the bottom electrode 502, is patterned to a width less than a width of the insulating layer 606 and the substrate 602. The bottom electrode 502 may be tantalum (Ta) or tantalum nitride (TaN).

In one configuration, the hard mask 306 may be a first top electrode, and the top electrode 302 may be a second top electrode deposited on the first top electrode. The first top electrode and the second top electrode may be tantalum (Ta) or tantalum nitride (TaN). The second top electrode may also be a conductive material.

It should be appreciated that the various layers of the MTJ stack in FIGS. 4, 5 and 6A-6D are provided merely for illustration and not for limitation. Additional layers may be added and/or layers may be removed or combined and may comprise different materials then illustrated.

The magnetic susceptibility and permeability for select materials that may form the high permeability material 406 such as Mu-metal, permalloys, iron (99.8% pure), and ferrite (nickel zinc) may be as follows. For example, Mu-metal has a permeability, ($\mu$ [H/m]) ranging from $2.5 \times 10^{-2}$ to $2.3 \times 10^{-2}$, a relative permeability ($\mu/\mu_0$) ranging from 20000-50000 and at a magnetic field of 0.002 T (for the $2.5 \times 10^{-2}$ permeability and 20000 relative permeability values). Permalloy has a magnetic susceptibility (Xm) of 8000, a permeability ($\mu$ [H/m]) of $1.0 \times 10^{-2}$ a relative permeability ($\mu/\mu_0$) of 8000 at a magnetic field of 0.002 T. Iron (99.8% pure) has a permeability ($\mu$ [H/m]) of $6.3 \times 10^{-2}$ a relative permeability ($\mu/\mu_0$) of 5000 at a magnetic field of 0.002 T. Ferrite (nickel zinc) has a permeability ($\mu$ [H/m]) range of $2.0 \times 10^{-5}$ to $8.0 \times 10^{-4}$, a relative permeability ($\mu/\mu_0$) range of 16-640 at a maximum frequency of 100 kHz to 1 MHz. Other materials are also contemplated for use as the high permeability material 406

Figure 7:
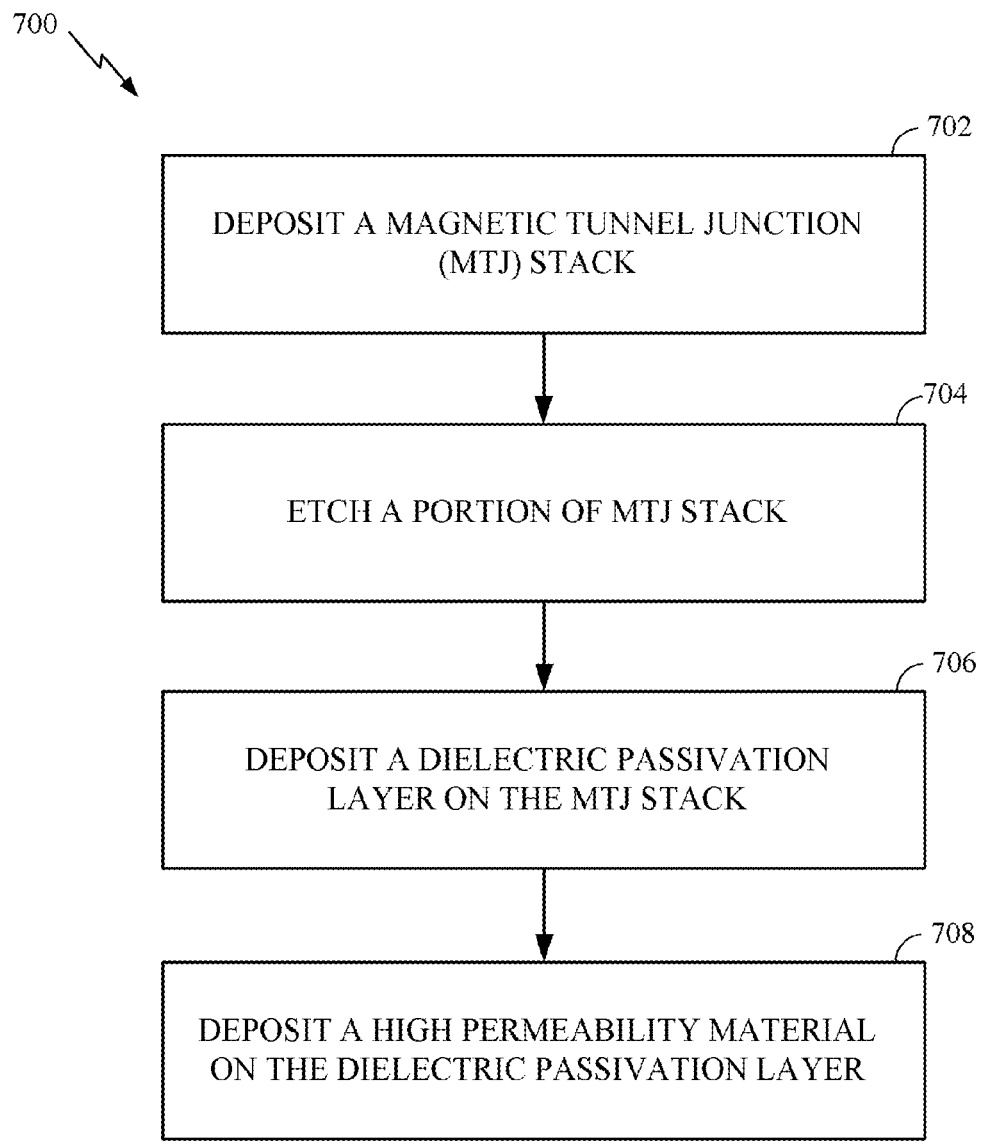
FIG. 7 is a process flow diagram illustrating a method of fabricating a pMTJ device according to aspects of the present disclosure.

FIG. 7 is a process flow diagram illustrating a method 700 of fabricating a pMTJ device according to an aspect of the present disclosure. In block 702, a magnetic tunnel junction (MTJ) stack is deposited. In block 704, a portion of the MTJ stack is etched. For example, the top electrode and perpendicular free layer can be etched. In block 706, a dielectric passivation layer (e.g., dielectric passivation layer 312) is deposited on the tunnel barrier of the MTJ stack. In block 708, a high permeability material (e.g., high permeability material 406) is deposited on the dielectric passivation layer. In one configuration, the method 700 further includes depositing an inter-metal dielectric (IMD) on the high permeability material.

According to one aspect of the present disclosure, a perpendicular magnetic tunnel junction (pMTJ) device includes a perpendicular reference layer, a tunnel barrier layer on a surface of the perpendicular reference layer, and a perpendicular free layer on a surface of the tunnel barrier layer. The pMTJ device also includes means for providing a stray field to the perpendicular free layer that compensates for the stray field from the perpendicular reference layer. In one configuration, the providing means is the high permeability material 406. In another configuration, the aforementioned means may be any material or any layer configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

In one configuration, the conductive material of the various conductive layers, such as the conductive material 604, is copper (Cu), or other conductive materials with high conductivity. Alternatively, the conductive material may include copper (Cu), silver (Ag), annealed copper (Cu), gold (Au), aluminum (Al), calcium (Ca), tungsten (W), zinc (Zn), nickel (Ni), lithium (Li) or iron (Fe). The aforementioned conductive material layers may also be deposited by electroplating, chemical vapor deposition (CVD), physical vapor deposition (PVD), sputtering, or evaporation.

Any insulating materials used in any of the aforementioned pMTJ structures such as the insulating layer 606 may be low k materials including silicon dioxide ($SiO_2$), silicon nitride (SiN), silicon oxynitride (SiON or $SiO_xN_y$) and fluorine-doped, carbon-doped, and porous carbon-doped forms, as well as spin-on organic polymeric dielectrics such as polyimide, polynorbornenes, benzocyclobutene (BCB) and polytetrafluoroethylene (PTFE), spin-on silicone based polymeric dielectrics and silicon nitrogen-containing oxy-carbides (SiCON).

Although not mentioned in the above process steps, photoresist, ultraviolet exposure through masks, photoresist development and lithography may be used. Photoresist layers may be deposited by spin-coating, droplet-based photoresist deposition, spraying, chemical vapor deposition (CVD), physical vapor deposition (PVD), sputtering, or evaporation. Photoresist layers may then be exposed and then etched by chemical etching processes using solutions such as Iron Chloride ($FeCl_3$), Cupric Chloride ($CuCl_2$) or Alkaline Ammonia ($NH_3$) to wash away the exposed photoresist portions, or dry etching processes using plasmas. Photoresist layers may also be stripped by a chemical photoresist stripping process or a dry photoresist stripping process using plasmas such as oxygen, which is known as ashing.

Figure 8:
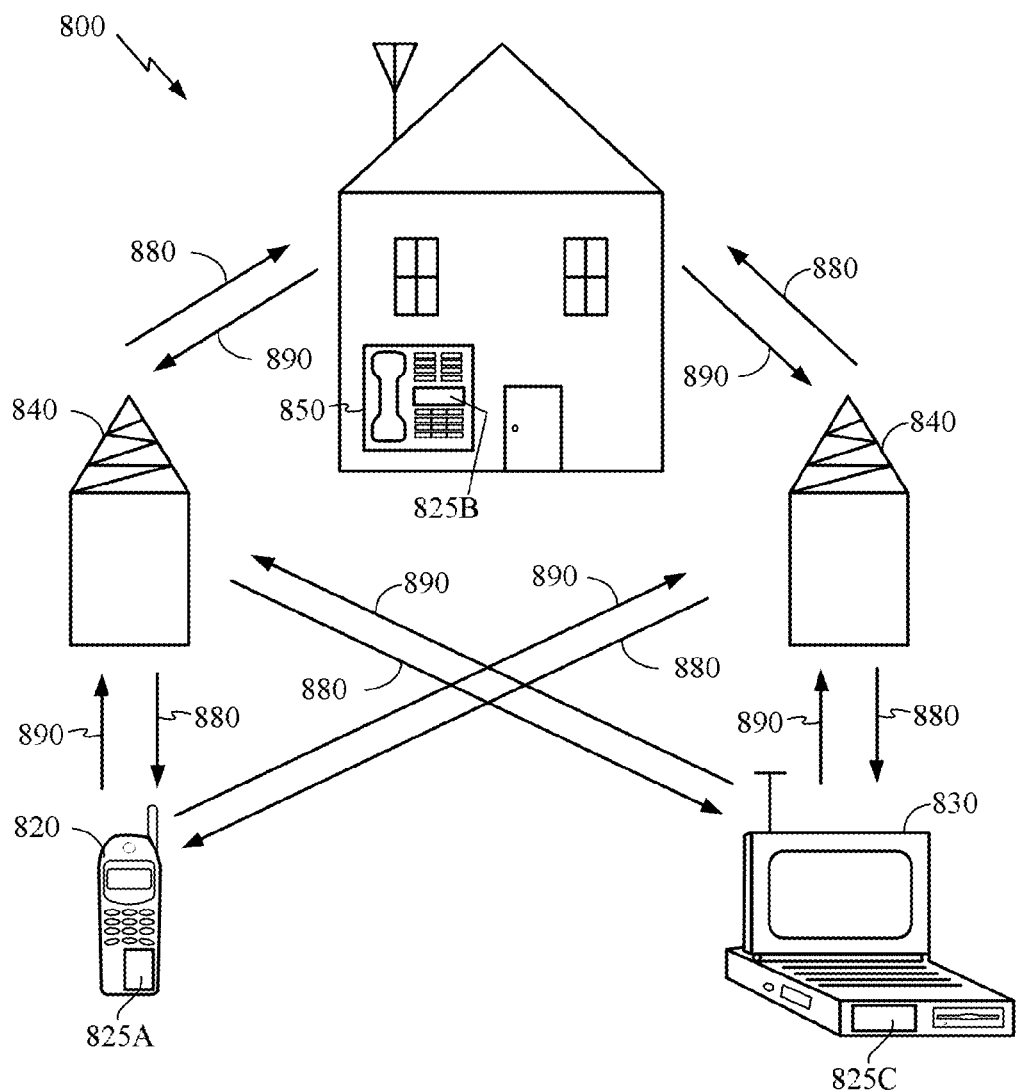
FIG. 8 is a block diagram showing an exemplary wireless communication system in which a configuration of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C and 825B that include the disclosed MTJ device. It will be recognized that other devices may also include the disclosed MTJ device, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music players, a video player, an entertainment unit, a fixed location data units such as meter reading equipment, or other devices that store or retrieve data or computer instructions, or combinations thereof. Although FIG. 8 illustrates remote units according to the teachings of the disclosure, the disclosure is not limited to these exemplary illustrated units. Aspects of the disclosure may be suitably employed in many devices, which include the disclosed MTJ devices.

Figure 9:
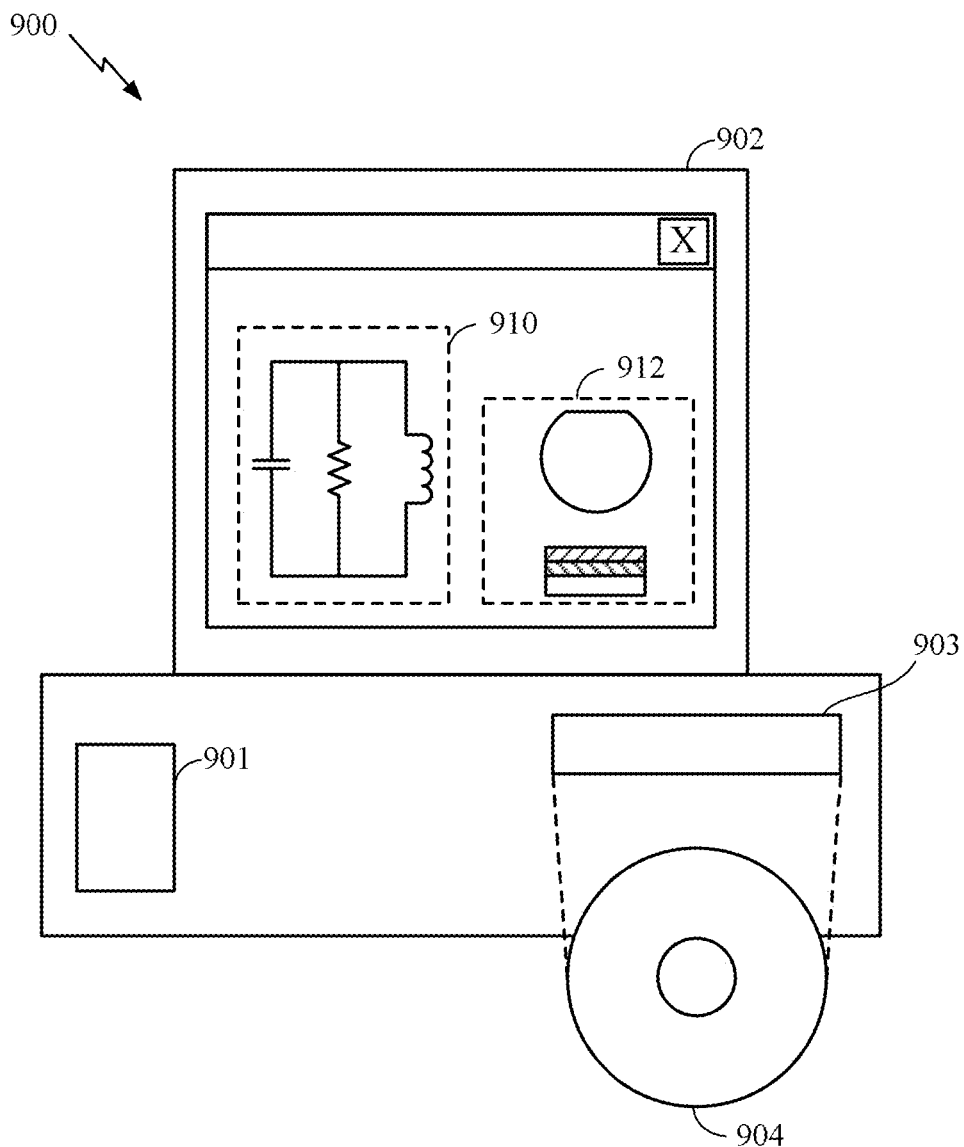
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the MTJ device disclosed above. A design workstation 900 includes a hard disk 901 containing operating system software, support files, and design software such as Cadence or OrCAD. The design workstation 900 also includes a display 902 to facilitate design of a circuit 910 or a semiconductor component 912 such as a MTJ device. A storage medium 904 is provided for tangibly storing the circuit design 910 or the semiconductor component 912. The circuit design 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may include specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 or the semiconductor component 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

It should be appreciated that memory devices including the MTJ storage elements described herein may be included within a mobile phone, a portable computer, a hand-held personal communication system (PCS) unit, a portable data unit such as a personal data assistant (PDA), a GPS enabled device, a navigation devices, a set top box, a music player, a video player, an entertainment unit, a fixed location data unit such as meter reading equipment, or any other device that stores or retrieves data or computer instructions, or any combination thereof. Accordingly, aspects of the disclosure may be suitably employed in any device, which includes active integrated circuitry including memory having MTJ storage elements as disclosed herein.

Further, it should be appreciated that various memory devices can include an array of MTJ storage elements as disclosed herein. Additionally, the MTJ storage elements may be used in various other applications, such as in logic circuits. Accordingly, although portions of the foregoing disclosure discuss the stand-alone MTJ storage element, it will be appreciated that various aspects can include devices into which the MTJ storage element is integrated.

Accordingly, aspects can include machine-readable media or computer-readable media embodying instructions which when executed by a processor transform the processor and any other cooperating elements into a machine for performing the functionalities described herein as provided for by the instructions.

While the foregoing disclosure shows illustrative aspects, it should be noted that various changes and modifications could be made herein without departing from the scope of the disclosure as defined by the appended claims. The functions, steps and/or actions of the method claims in accordance with the aspects described herein need not be performed in any particular order. Furthermore, although elements of the aspects may be described or claimed in the singular, the plural is contemplated unless limitation to the singular is explicitly stated.

Although the present disclosure and its advantages have been described in detail, it should be understood that various changes, substitutions and alterations can be made herein without departing from the technology of the disclosure as defined by the appended claims. For example, relational terms, such as "above," "below," "top" and "bottom" are used with respect to a substrate or electronic device. Of course, if the substrate or electronic device is inverted, above becomes below, top becomes bottom and vice versa. Additionally, if oriented sideways, the terms "above," "below," "top" and "bottom" may refer to sides of a substrate or electronic device, for example.

The word "exemplary" is used herein to mean "serving as an example, instance, or illustration." Any aspect described herein as "exemplary" is not necessarily to be construed as preferred or advantageous over other aspects. Likewise, the term "aspects of the disclosure" does not require that all aspects of the disclosure include the discussed feature, advantage or mode of operation. The terminology used herein is for the purpose of describing particular aspects only and is not intended to be limiting of aspects of the disclosure.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A perpendicular magnetic tunnel junction (pMTJ) device, comprising:
   a perpendicular reference layer;
   a tunnel barrier layer on a surface of the perpendicular reference layer;
   a perpendicular free layer on a surface of the tunnel barrier layer, the perpendicular reference layer and the tunnel barrier layer extending laterally beyond the perpendicular free layer;
   a capping layer on a surface of the perpendicular free layer, the perpendicular free layer interposed between the capping layer and the tunnel barrier layer;
   a dielectric passivation layer on the tunnel barrier layer and surrounding the perpendicular free layer and the capping layer;
   a permeable material layer supported by a first portion of the dielectric passivation layer and surrounding a second portion of the dielectric passivation layer that surrounds the capping layer, the permeable material layer and the dielectric passivation layer being formed of different materials, the first portion of the dielectric passivation layer interposed directly between the permeable material layer and the tunnel barrier layer, the permeable material layer arranged to be magnetized by the perpendicular reference layer, the magnetized permeable material layer to provide another stray field to the perpendicular free layer that compensates for a stray field from the perpendicular reference layer, an outer sidewall of the permeable material layer being aligned with a sidewall of the dielectric passivation layer and a sidewall of at least one of the perpendicular reference layer and the tunnel barrier layer; and
   an electrode directly contacting the dielectric passivation layer, sidewalls of the capping layer, and an inner sidewall of the permeable material layer, the permeable material layer located between the electrode and the first portion of the dielectric passivation layer.

2. The pMTJ device of claim 1, in which the perpendicular reference layer comprises a single layer.

3. The pMTJ device of claim 1, in which the perpendicular reference layer comprises a synthetic antiferromagnetic (SAF) layer.

4. The pMTJ device of claim 1, in which the permeable material layer comprises a Mu-metal material layer, a nickel iron (NiFe)-based material layer, a ferrite material layer, a permalloy material layer, an oxygen doping material layer, or a nitride doping material layer.

5. The pMTJ device of claim 1, in which the dielectric passivation layer comprises silicon nitride (SiN), silicon oxynitride (SiON or $SiO_xN_y$), aluminum oxide ($AlO_x$), or silicon oxide ($SiO_x$).

6. The pMTJ device of claim 1, in which the perpendicular free layer comprises a synthetic antiferromagnetic (SAF) layer, the pMTJ device integrated into a mobile phone, a set top box, a music player, a video player, an entertainment unit, a navigation device, a computer, a hand-held personal communication systems (PCS) unit, a portable data unit, and/or a fixed location data unit.

7. A perpendicular magnetic tunnel junction (pMTJ) device, comprising:
   a perpendicular reference layer;
   a tunnel barrier layer on a surface of the perpendicular reference layer;
   a perpendicular free layer on a surface of the tunnel barrier layer, the perpendicular reference layer and the tunnel barrier layer extending laterally beyond the perpendicular free layer;
   a capping layer on a surface of the perpendicular free layer, the perpendicular free layer interposed between the capping layer and the tunnel barrier layer;

a dielectric passivation layer on the tunnel barrier layer and surrounding the perpendicular free layer and the capping layer;

means for providing a stray field to the perpendicular free layer supported by a first portion of the dielectric passivation layer and surrounding a second portion of the dielectric passivation layer that surrounds the capping layer, the means for providing the stray field and the dielectric passivation layer being formed of different materials, the first portion of the dielectric passivation layer interposed directly between the means for providing the stray field and the tunnel barrier layer, in which the stray field providing means compensates for a stray field from the perpendicular reference layer, an outer sidewall of the means for providing the stray field being aligned with a sidewall of the dielectric passivation layer and a sidewall of at least one of the perpendicular reference layer and the tunnel barrier layer; and an electrode directly contacting the dielectric passivation layer, sidewalls of the capping layer, and an inner sidewall of the means for providing the stray field, the means for providing the stray field located between the electrode and the first portion of the dielectric passivation layer.

8. The pMTJ device of claim 7, in which the perpendicular reference layer comprises a single layer.

9. The pMTJ device of claim 7, in which the perpendicular reference layer comprises a synthetic antiferromagnetic (SAF) layer.

10. The pMTJ device of claim 7, in which the providing means comprises a Mu-metal material layer, a nickel iron (NiFe)-based material layer, a ferrite material layer, a permalloy material layer, an oxygen doping material layer, or a nitride doping material layer.

11. The pMTJ device of claim 7, in which the dielectric passivation layer comprises silicon nitride (SiN), silicon oxynitride (SiON or $SiO_xN_y$), aluminum oxide ($AlO_x$), or silicon oxide ($SiO_x$).

12. The pMTJ device of claim 7, in which the perpendicular free layer comprises a synthetic antiferromagnetic (SAF) layer, the pMTJ device integrated into a mobile phone, a set top box, a music player, a video player, an entertainment unit, a navigation device, a computer, a handheld personal communication systems (PCS) unit, a portable data unit, and/or a fixed location data unit.

* * * * *